(12) United States Patent
Ritter

(10) Patent No.: US 7,466,129 B2
(45) Date of Patent: Dec. 16, 2008

(54) METHOD FOR GENERATING A MAGNETIC RESONANCE IMAGE

(75) Inventor: Dieter Ritter, Fürth (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 11/757,590

(22) Filed: Jun. 4, 2007

(65) Prior Publication Data

US 2007/0285092 A1 Dec. 13, 2007

(30) Foreign Application Priority Data

Jun. 7, 2006 (DE) .................. 10 2006 026 542

(51) Int. Cl.
*G01V 3/00* (2006.01)
(52) U.S. Cl. ...................... 324/309; 324/307
(58) Field of Classification Search ................. 324/309, 324/307, 306, 312
See application file for complete search history.

(56) References Cited

U.S. PATENT DOCUMENTS

| | | | |
|---|---|---|---|
| 4,709,212 A * | 11/1987 | MacFall et al. ............. 324/309 |
| 5,003,264 A * | 3/1991 | Koizumi et al. ............. 324/309 |
| 6,088,488 A * | 7/2000 | Hardy et al. ................ 382/278 |
| 6,320,378 B1 * | 11/2001 | Maier et al. ................. 324/307 |
| 6,448,771 B1 | 9/2002 | Harvey et al. |
| 6,483,308 B1 * | 11/2002 | Ma et al. ..................... 324/312 |
| 2003/0210045 A1 | 11/2003 | Mitchell et al. |

OTHER PUBLICATIONS

"Dynamic Imaging With Multiple Resolutions Along Phase-Encode and Slice-Select Dimensions," Panych et al, Magnetic Resonance In Medicine, vol. 45, (2001) pp. 940-947.

"Potential Degradation in Image Quality Due to Selective Averaging of Phase-Encoding Lines in Fourier Transform MRI," Mugler, Magnetic Resonance In Medicine, vol. 19 (1991) pp. 170-174.

* cited by examiner

*Primary Examiner*—Louis M Arana
(74) *Attorney, Agent, or Firm*—Schiff Hardin LLP

(57) ABSTRACT

In a method for image generation by magnetic resonance, a first MR raw data set is acquired with a first resolution in k-space, at least one further raw data set is acquired with a resolution in k-space that is reduced relative to that of the first raw data set, the acquired raw data sets are transferred into three-dimensional space for generation of image data the various image data are averaged for generation of an averaged image data set and the averaged image data set is displayed as an MR image.

8 Claims, 3 Drawing Sheets

METHOD FOR GENERATING A MAGNETIC RESONANCE IMAGE

BACKGROUND OF THE INVENTION

1. Field of the Invention

The present invention concerns in general magnetic resonance systems (or magnetic resonance tomography system) as used in medicine for examination of patients.

2. Description of the Prior Art

Magnetic resonance tomography is based on the physical phenomenon of nuclear magnetic resonance and is successfully used as an imaging method in medicine and biophysics. The water protons present in the body, or their nuclear spins, align in a strong, constant magnetic field. These nuclear spins can be brought out of the equilibrium state by the radiation of a radio-frequency pulse, and they relax again into this equilibrium state with specific relaxation times. These relaxation phenomena can be detected with suitable acquisition coils. The spatial resolution ensues by switching of additional currents in gradient coils for generation of magnetic field gradients. The precession frequency of the spins changes dependent on the location.

The acquisition of the data in magnetic resonance tomography ensues in k-space, or Fourier space. The magnetic resonance image (MR image) considered by the physician is obtained by a Fourier transformation of the MR raw data. Generally, gradients are activated in all three spatial directions for spatial coding of an examined subject. Differentiation is made between the slice-selection gradients, the phase coding gradients and the gradients during which the signal readout ensues.

In order to improve the signal-to-noise ratio, it is known to identically repeat a specific measurement sequence (i.e. a specific sequence of gradient switchings) and ultimately to average the signals of both measurements in order to present an averaged MR image that has a better signal-to-noise ratio. However, this leads to significantly longer acquisition times.

SUMMARY OF THE INVENTION

An object of the present invention is to provide a method for image generation by means of magnetic resonance with which the signal-to-noise ratio is improved without having to increase the time for the image acquisition to the same degree.

The above object is achieved in accordance with the invention by a method for image generation by magnetic resonance that includes the following steps. First, a first MR raw data set is acquired with a first resolution in k-space. A further raw data set is acquired in k-space that has a resolution that is reduced relative to the first raw data set. The acquired raw data sets are transformed in three-dimensional space or (image space), thereby generating image data. The image data are then averaged to generate an averaged image data set and this averaged image data set is presented as an MR image. By the averaging of an MR raw data set with a first resolution and an MR raw data set with a second resolution, either the acquisition time is reduced relative to averagings of identical MR raw data sets or (if the same acquisition time as for typical averagings is used) the signal-to-noise ratio can be improved.

According to a preferred embodiment of the invention, the resolution of the raw data set is reduced in one spatial direction that is perpendicular to the direction of the signal readout. By the reduction of the resolution in one k-space direction in the further acquired raw data set, and the subsequent averaging of the Fourier-transformed image data, an MR image is obtained having spatial resolution in the one direction that is just as good as in the case of an averaging of two identical raw data sets. It is accepted in exchange that the spatial resolution in the other spatial direction is poorer.

Multiple MR raw data sets are advantageously acquired, with the resolution of one raw data set relative to the resolution of the previously-acquired raw data set being reduced. The resolution of a raw data set is advantageously essentially halved relative to the next raw data set. This means that the number of the k-space lines that are read out during a signal readout is essentially halved given each further acquired MR raw data set.

The portions of the raw data that are not acquired in a data set with reduced resolution are filled with zeros until the same k-space volume has been acquired as in the first MR raw data set. The resolution in the phase coding direction is advantageously reduced. For example, for an MR raw data set with reduced resolution, the k-space line that is not acquired can then, for example, be filled with zeros.

DESCRIPTION OF THE PREFERRED EMBODIMENTS

Figure 1:
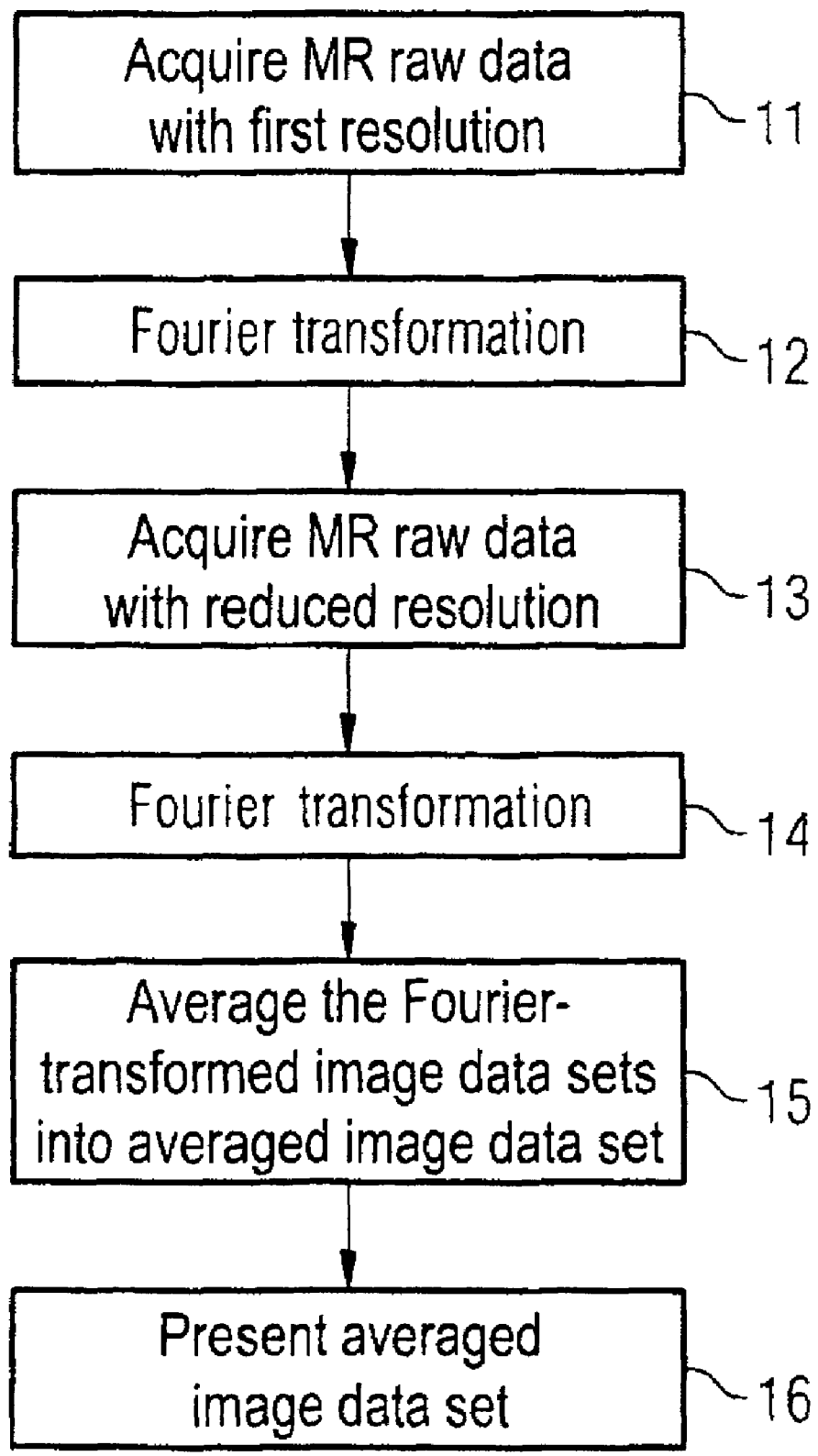
FIG. 1 is a flow chart showing the basic inventive steps for acquisition of an MR image with improved signal-to-noise ratio.

The basic steps for acquisition of an MR image according to the invention are shown in FIG. 1. A first MR raw data set with a first resolution is acquired in a first step 11. The Fourier transformation of this data set in three-dimensional or, respectively, image space ensues in a step 12. A further raw data set is acquired in a further step 13, whereby this raw data set acquired during the step 13 has a reduced resolution relative to the first raw data set. The resolution is advantageously essentially halved relative to the first raw data set, This means that only approximately half of the k-space volume is acquired in step 13 in comparison to the acquisition of k-space in step 11, the acquisition time for this second data set also essentially being halved. The second raw data set is Fourier-transformed in image space in step 14. The Fourier-transformed image data sets are then added to obtain an averaged image data set in step 15. The averaged image data set is then displayed in step 16. Further MR raw data sets naturally can be acquired before step 15, with the resolution of the raw data set respectively essentially being halved from one raw data set to the next. The portion of the k-space volume that was not acquired in comparison with the first MR raw data set is filled with zeros until the size of k-space is identical to the first raw data. Phantom images are exemplarily shown in FIG. 2. The MR image 21 is an MR image that was acquired with a conventional averaging methodology. This means that an MR image with a predetermined k-space resolution is acquired twice and is subsequently averaged. The inventive averaging method with identical measurement time was applied in the MR image 22. For example, gradient echo exposures of a phantom were acquired with the conventional averaging method according to image 21 with a repetition time of 100 ms and a k-space size of 1024×1024. The acquisition time of a single image was 1:44 min for the example from FIG. 2. In the shown image 21 a technique known as an "averaging equals 2" was used, meaning that the same image was measured again with identical resolution and added, which leads to a total measurement time of 3:28 min.

Figure 2:
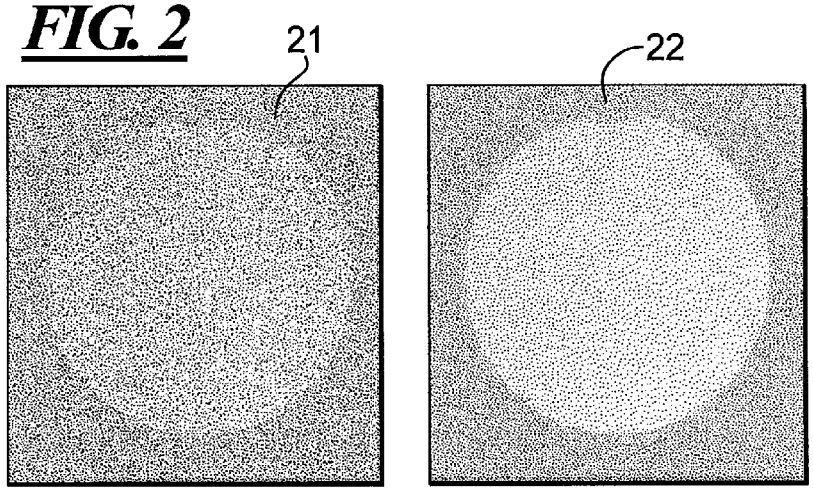
FIG. 2 shows an MR image with conventional averaging and an MR image with averaging according to the invention.

In the method used in image 22 a first k-space volume was likewise acquired with 1024×1024 points in k-space and a repetition time of 100 ms, which likewise leads to a measurement time of 1:44 min. A second MR raw data set with a resolution of 512×1024 k-space points was acquired in a further step, which leads to a measurement time of 53 s. A k-space raw data set with 256×1024 points was subsequently acquired with a measurement time of 27 s. An MR acquisition with an MR raw data set of 133×1024 points subsequently ensued with a measurement time of 15 s, and finally an acquisition of an MR raw data set with 64×1024 k-space points with a measurement time of 8 s. As can be seen from the example above, the resolution in the phase coding direction was respectively halved. If the measurement times for the acquisition of the raw data from 1024×1024 to 64×1024 are now added, a total measurement time of 3:27 min for the MR image shown in FIG. 2 is obtained. This is essentially identical with the acquisition time of image 21. As is to be recognized from the two images, the signal-to-noise ratio in image 22 according to the present invention is distinctly better relative to a method with conventional averaging.

Figure 5:
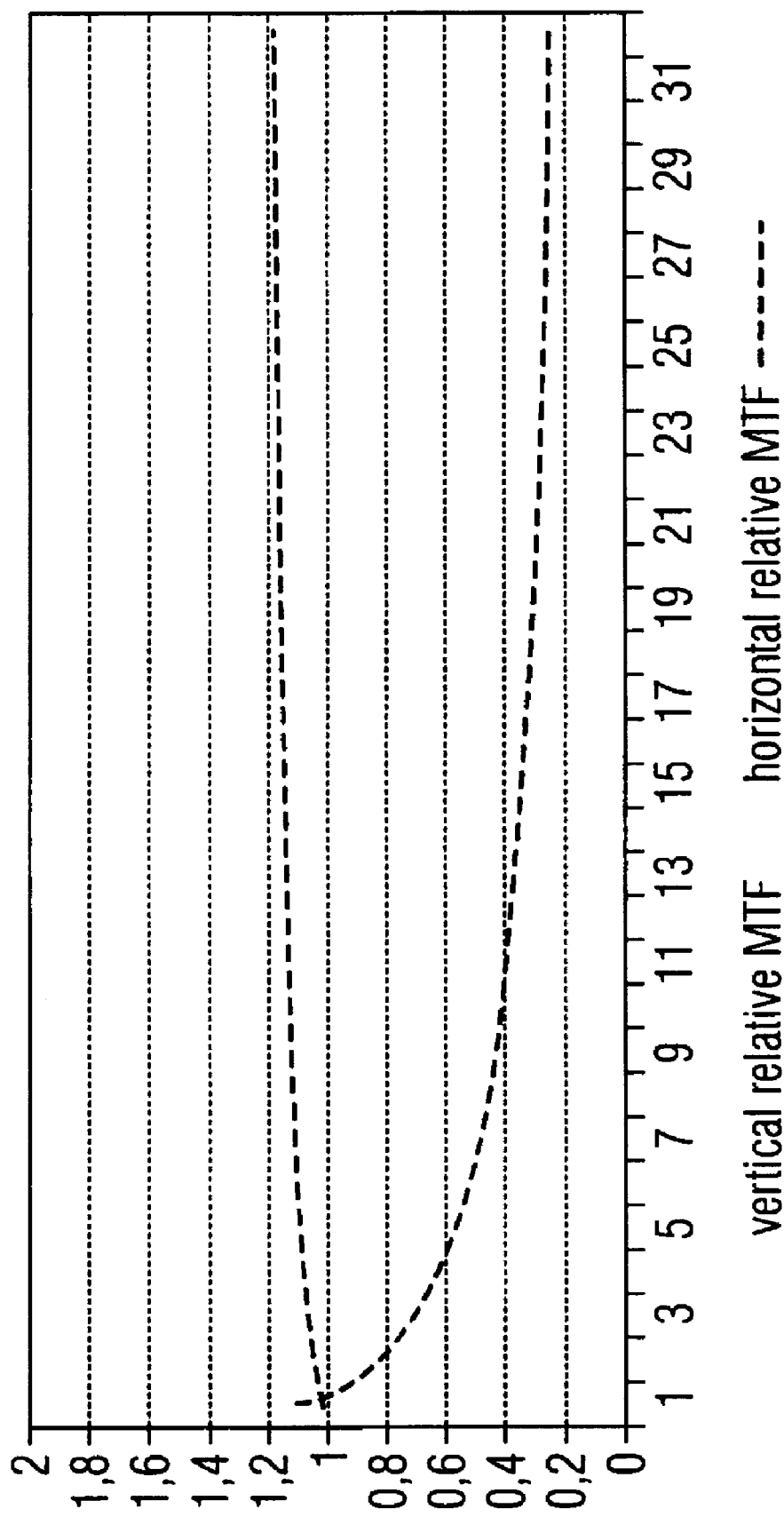
FIG. 5 is an estimation of the relative modulation transfer function for a method according to the invention in comparison to the prior art.

The relative modulation transfer function for both methods is shown in FIG. 5. The modulation transfer function is a measure for the spatial resolution, i.e. up to which pitch two lines can be shown separate from one another. In image 5 the relative modulation transfer function is plotted over the spatial frequency from zero up to the Nyquist frequency. The horizontal relative modulation transfer functions of both methods approximately correspond. However, as expected the relative vertical modulation transfer function clearly decreases perpendicular to this (in the phase coding direction) up to the image edge of k-space. As can be seen from FIGS. 2 and 5 in synopsis, a significant improvement of the signal-to-noise ratio is obtained with a factor of approximately 2.5. This improved signal-to-noise ratio is bought via a reduced spatial resolution in one spatial direction. However, overall the image does not appear to be correspondingly less sharp to the observer because the spatial direction in the other spatial direction is the same as in the comparison method.

Figure 3:
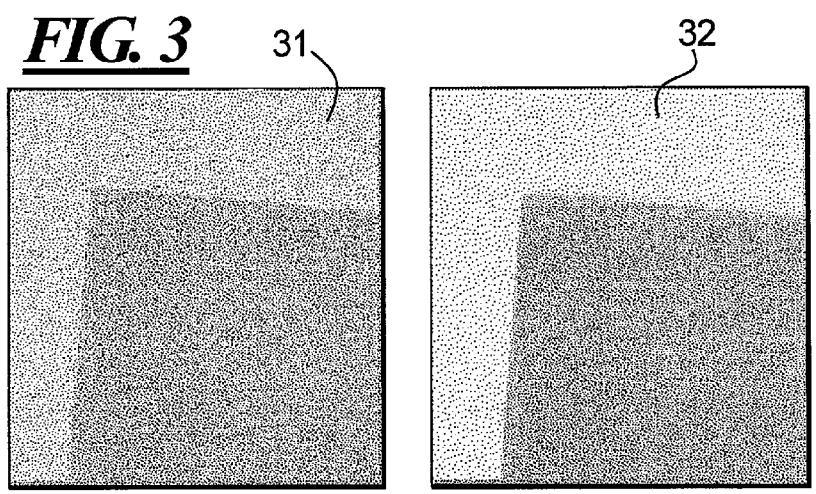
FIG. 3 shows an MR image of an edge with a conventional averaging and an averaging according to the invention.

Sections from edge images of phantom measurements that confirm the reduced resolution in the phase coding direction are shown in FIG. 3. Image 31 shows the edge of a phantom with a conventional averaging of two identical raw data; MR image 32 shows the same MR image that was acquired with approximately the same acquisition time with a method according to the invention. The signal-to-noise ratio or the contrast for the observer is essentially improved in image 32, however the edge in the vertical direction is rendered more softly than in the comparison image 31.

Figure 4:
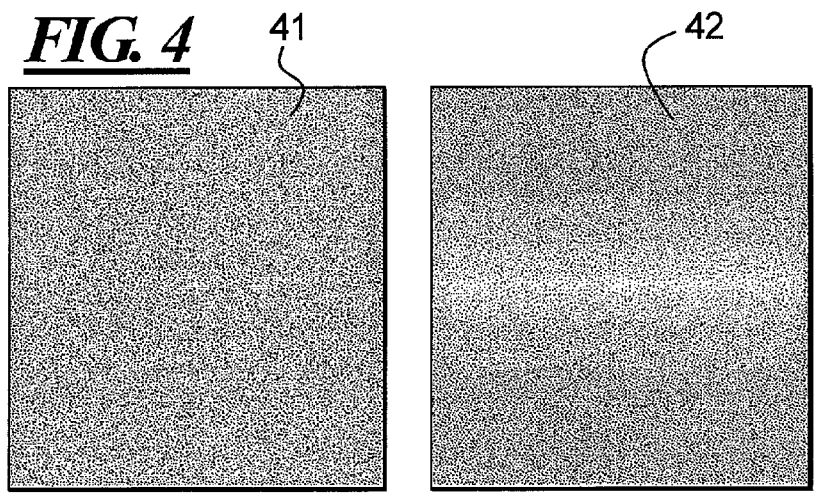
FIG. 4 shows the noise power spectrum given a conventional averaging and an averaging according to the invention.

The noise power spectrum (NPS) is shown in FIG. 4 for a conventional averaging and an averaging according to the invention. The noise power spectrum in a conventional averaging shows an orientation-independent distribution of the noise while, contrarily, an orientation-dependent distribution of the noise appears in the noise power spectrum according to the present invention. A smaller noise in the vertical direction partially compensates for the lower vertical resolution.

In summary, the multi-scalar approach with MR raw data of different resolutions that are averaged into an MR image enables an increase of the signal-to-noise ratio given equivalent measurement time in comparison to conventional averaging methods. The improved signal-to-noise ratio is "achieved" with a loss of the spatial resolution in one spatial direction but this does not significantly matter to the observer since the resolution in the other direction is not impaired.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method for generating a magnetic resonance image comprising the steps of:
    acquiring a first magnetic resonance raw data set from an object and entering said first magnetic raw data set into k-space with a first resolution that will result in a degree of filling of k-space;
    dependent on said degree of filling of k-space, selecting a second resolution that is reduced relative to said first resolution and acquiring at least one further magnetic resonance raw data set from the object and entering said at least one further raw data set into k-space with a second resolution that is reduced relative to said first resolution;
    transforming said first raw data set and said at least one further raw data set in k-space into three-dimensional space to generate image data;
    averaging said image data to generate an averaged image data set; and
    displaying said averaged image data set as a magnetic resonance image.

2. A method as claimed in claim 1 comprising acquiring said first raw data set and said at least one further raw data set in a signal readout direction, and acquiring said at least one further raw data set with said second resolution being reduced relative to said first resolution in a direction perpendicular to said signal readout direction.

3. A method as claimed in claim 1 comprising acquiring a plurality of further magnetic resonance raw data sets in succession, each raw data set in said plurality of raw data sets having a resolution that is reduced relative to the resolution of the immediately preceding further raw data set dependent on the degree of filling of k-space by said preceding further raw data set.

4. A method as claimed in claim 3 wherein the respective resolutions of said plurality of further magnetic resonance raw data sets are reduced in one direction of k-space, with each resolution being substantially one-half of the resolution of the immediately previously acquired further raw data set.

5. A method as claimed in claim 1 comprising acquiring said at least one further raw data set with said second resolution being substantially one-half of said first resolution.

6. A method as claimed in claim 1 comprising filling portions in k-space with zeros that are not acquired in said at least one further raw data set, due to said second resolution being reduced relative to said first resolution.

7. A method as claimed in claim 6 comprising filling a central region of k-space with zeros in order to reduce said second resolution relative to said first resolution.

8. A method as claimed in claim 1 wherein each of said first raw data set and said at least one further raw data set has a phase-coding direction associated therewith, and comprising acquiring said at least one further raw data set with said second resolution reduced in said phase coding direction relative to said first resolution.

* * * * *